US007864001B2

(12) United States Patent
Downs et al.

(10) Patent No.: US 7,864,001 B2
(45) Date of Patent: Jan. 4, 2011

(54) MANIFOLD COMBINER FOR MULTI-STATION BROADCAST SITES APPARATUS AND METHOD

(75) Inventors: Henry Downs, Portland, ME (US); Kevin Lorenz, Raymond, ME (US)

(73) Assignee: SPX Corporation, Charlotte, NC (US)

( * ) Notice: Subject to any disclaimer, the term of this patent is extended or adjusted under 35 U.S.C. 154(b) by 1160 days.

(21) Appl. No.: 11/495,466

(22) Filed: Jul. 31, 2006

(65) Prior Publication Data

US 2007/0252661 A1 Nov. 1, 2007

Related U.S. Application Data

(60) Provisional application No. 60/791,886, filed on Apr. 14, 2006.

(51) Int. Cl.
*H03H 7/38* (2006.01)
*H03H 7/48* (2006.01)

(52) U.S. Cl. ........................ 333/126; 333/129; 333/132

(58) Field of Classification Search ................. 333/110, 333/114, 121–123, 126, 129, 132, 135
See application file for complete search history.

(56) References Cited

U.S. PATENT DOCUMENTS 2,547,054 A * 4/1951 Smullin ...................... 333/121
2,713,152 A * 7/1955 Brown ........................ 333/126
4,258,435 A * 3/1981 Levy et al. .................. 370/497
4,614,920 A * 9/1986 Tong .......................... 333/135
5,428,323 A * 6/1995 Geissler et al. ............. 333/135
5,438,572 A * 8/1995 Rauscher .................... 370/497
5,493,258 A * 2/1996 Parker ........................ 333/134
5,602,365 A * 2/1997 Bobadilla et al. ......... 174/71 C
6,201,949 B1 * 3/2001 Kich et al. ................. 455/12.1
6,472,951 B1 * 10/2002 Fiedziuszko et al. ........ 333/126
6,617,944 B2 * 9/2003 Latouche et al. ............ 333/212
6,710,813 B1 * 3/2004 Grandchamp et al. ....... 348/487
7,397,325 B2 * 7/2008 Yu et al. ..................... 333/135

* cited by examiner

*Primary Examiner*—Robert Pascal
*Assistant Examiner*—Kimberly E Glenn
(74) *Attorney, Agent, or Firm*—Baker & Hostetler LLP

(57) ABSTRACT

A manifold combiner for a plurality of radio frequency electromagnetic signals includes a first RF bandpass filter element with input and output ports and a first junction element, wherein the first junction element includes a first port connected to the first filter output port, a second port connected to a shorted stub element, and a third port functioning as an output. The signal path toward the stub appears as an open to the first filter. The combiner further includes at least one additional filter element and junction element, with the second port of the additional junction element fed from the output of the previous junction element. Interconnecting sections couple the respective elements. Dimensions of interconnecting sections are selected such that each filter element output sees a single path out of the manifold, through the output of the last junction element, with all other possible paths appearing as open circuits.

16 Claims, 13 Drawing Sheets

MANIFOLD COMBINER FOR MULTI-STATION BROADCAST SITES APPARATUS AND METHOD

CLAIM OF PRIORITY

This application claims priority to a U.S. provisional application entitled, "Manifold Combiner for Multi-Station Broadcast Sites Apparatus and Method", filed Apr. 14, 2006, having Ser. No. 60/791,886, which is hereby incorporated by reference in its entirety.

FIELD OF THE INVENTION

The present invention relates generally to radio frequency electromagnetic signal (RF) broadcasting. More particularly, the present invention relates to techniques for combining multiple high-level broadcast signals for transmission from a single transmitting antenna.

BACKGROUND OF THE INVENTION

Broadcasting, whether for entertainment or other purposes, requires significant amounts of land for transmitters, towers, and/or antennas. The towers and/or antennas may be guyed, which can add to the size of an installation. In many locations (or "markets") around the world, broadcasters have pooled resources to consolidate land use to small numbers of facilities with complex apparatus. This strategy is recognized and regulated by agencies, such as the Federal Communications Commission (FCC) in the U.S., which have oversight regarding the broadcast characteristics of each signal as well as issues such as interaction between signals. In recent years, the addition of digital broadcasting to the previous and continuing analog broadcasting has made this situation still more complex.

Within entertainment broadcasting, a distinction may be drawn between television (TV), both very-high-frequency (VHF) and ultra-high-frequency (UHF), on the one hand, and radio, both medium-frequency (MF) amplitude modulated (AM) and very-high-frequency (VHF) frequency-modulated (FM). A basis for distinction is bandwidth of each signal. Where TV is assigned channels that are 6 MHz wide (in the U.S.) and have multiple subcarriers operating in synchrony within the channel, radio channels are 20 kHz wide for AM and extend to +/−200 kHz for FM, and each operate with a single carrier. Digital broadcasting for TV and for AM and FM radio uses a variety of mechanisms to interoperate with analog substantially free of interference.

Radio, thanks to its narrower bandwidth, is capable of being received with lower incident signal energy than TV, and thus typically achieves greater range for a given transmitter power level. The FM band is assigned between the low and high VHF TV assignments. Digital broadcasting for TV is scheduled as of this filing to complete replacement of analog within a few years, in concert with shutting down existing VHF TV channels and reassigning this bandwidth to new users. FM radio broadcasting is not so circumscribed; digital and analog signals are scheduled to coexist indefinitely, and the present VHF band assignment for FM is expected to remain unchanged.

As noted, because of high demand for programming differentiation and for other reasons, many FM stations, particularly those in high-demand regional markets, pool resources, which resources in various instances may include one or more of transmitters, high-power signal transmission lines, antenna tower structures, and antennas. Certain pooling strategies for multi-station FM sites are relatively simple, while others have proven to be challenging.

Historically, some multi-station FM sites have successfully used multi-station combiners to combine several separate high-power station signals (i.e., signal outputs from separate transmitters) onto a common transmission line. The combined signal can then be fed into an appropriate broadband antenna to be radiated into free space. Multi-station combiners of known types have typically relied on combiner techniques such as branch combiners and multiple Constant Impedance Filters (CIFs). The combiners that can be built from such component parts—each component being large and expensive—are demonstrably successful, and have significant benefits, but have limitations that suggest that other solutions to the challenge of developing cost-effective and reliable FM radio service may be worthy of consideration.

What is needed in the art is a combiner technology for multi-station FM sites that achieves performance at least comparable to that of known systems while representing negligible technical risk and offering a much-reduced cost. Were such needs met, extension of the technology beyond FM radio broadcasting into other areas would also be potentially useful.

SUMMARY OF THE INVENTION

The foregoing needs are met, to a great extent, by the present invention, wherein an apparatus is provided that in some embodiments provides a combiner that accepts a plurality of high-level input signals on separate and isolated input ports and produces a high-level signal on an output port for delivery to a transmitting antenna.

In accordance with one embodiment of the present invention, a manifold combiner for a plurality of radio frequency electromagnetic (RF) signals is presented. The combiner includes a first bandpass filter, configured to pass a first RF signal, wherein the first filter has an RF signal input port and an RF signal output port, and a first junction section, wherein the first junction section includes a first port connected to and capable of interchanging RF signals with the first filter output port, a second port capable of interchanging RF signals applied to the first junction section, and a third port capable of interchanging RF signals applied to the first junction section.

In accordance with another embodiment of the present invention, a combiner for a plurality of radio frequency electromagnetic (RF) signals is presented. The combiner includes means for bandpass filtering a first RF signal, wherein the first filtering means further includes means for accepting a first unfiltered RF signal input at an input port thereof, and means for emitting a first filtered RF signal output at an output port thereof, wherein the first filtered RF signal output port has a first effective short-circuit locus for out-of-band RF signals proximal thereto.

In accordance with yet another embodiment of the present invention, a method for combining a plurality of radio frequency electromagnetic (RF) signals is presented. The method includes bandpass filtering a first RF signal, wherein filtering the first RF signal further includes accepting a first unfiltered RF signal input at a first input port and emitting a first filtered RF signal output at a first output port, wherein the first filtered RF signal output port has a first effective short-circuit locus for out-of-band RF signals proximal thereto. The method further includes accepting the first filtered RF signal output at a first locus discrete from the first out-of-band RF signal short-circuit locus, directing the first filtered RF signal output in two directions from the first discrete locus along two separate signal paths having controlled impedance, wherein the signal paths exhibit substantially equal signal magnitude, phase, and impedance characteristics, wherein the outputs in the two directions share a single common spatial reference point of origin, wherein the common point of origin is the first effective out-of-band short-circuit locus proximal to the first filtered signal output port, and positioning, in a first one of the two signal paths, a substantially total reflector for such RF signals as enter the first signal path, wherein the reflector is so positioned as to cause the first signal path to act as an open circuit for the signals.

There have thus been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments, and of being practiced and carried out in various ways. It is also to be understood that the phraseology and terminology employed herein, as well as the abstract, are for the purpose of description, and should not be regarded as limiting.

As such, those skilled in the art will appreciate that the conception upon which this disclosure is based may readily be utilized as a basis for the designing of other structures, methods, and systems for carrying out the several purposes of the present invention. It is important, therefore, that the claims be regarded as including such equivalent constructions insofar as they do not depart from the spirit and scope of the present invention.

DETAILED DESCRIPTION OF PREFERRED EMBODIMENTS OF THE INVENTION

Figure 1:
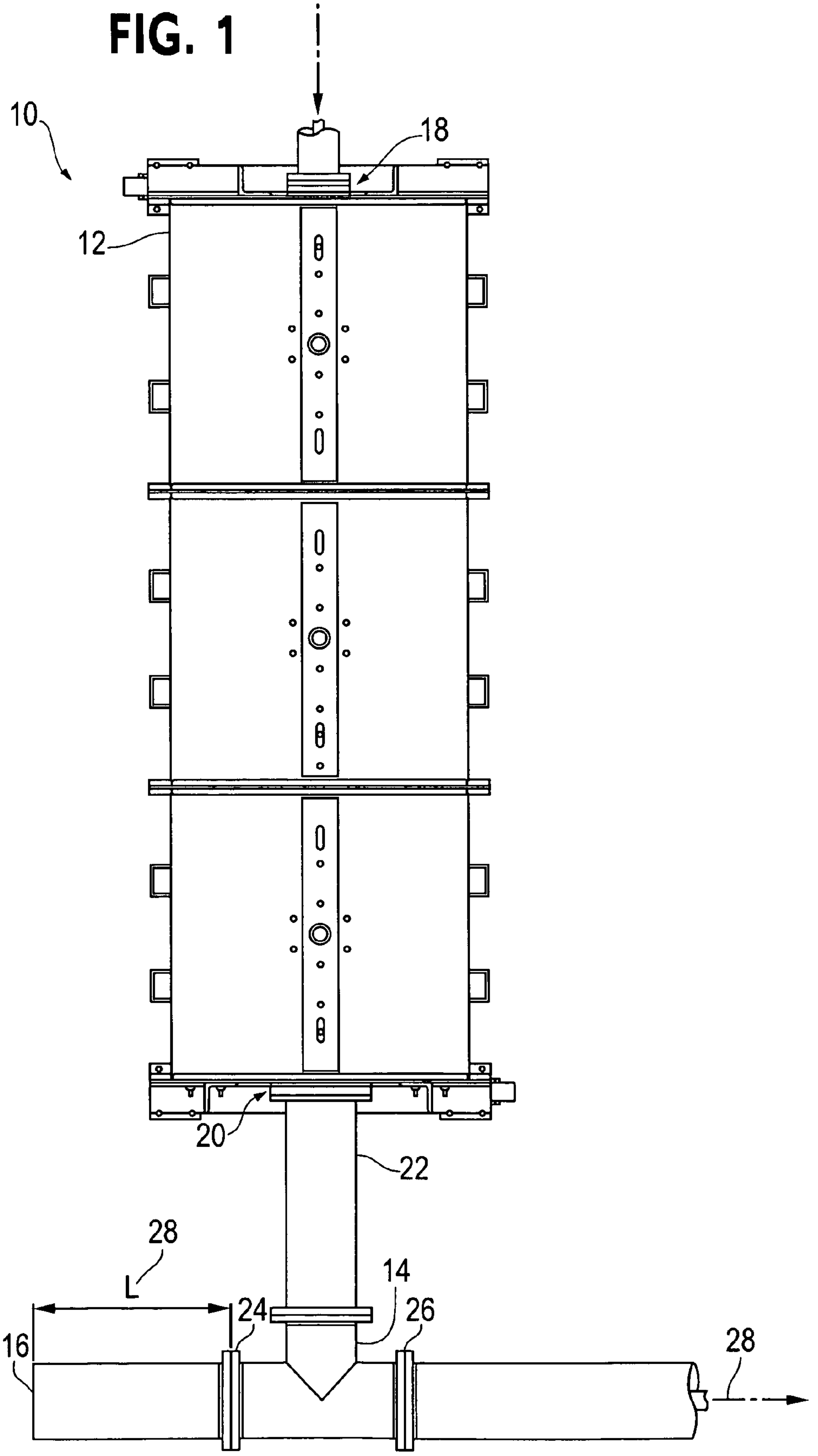
FIG. 1 is a side view of one combiner segment according to an embodiment of the invention.

The invention will now be described with reference to the drawing figures, in which like reference numerals refer to like parts throughout. The present invention provides an apparatus and method that in some embodiments provides a combiner that places a plurality of broadcast-level signals on a single transmission line.

The present invention uses a short-circuited manifold into which a number of signals are fed. The number of signals to be combined determines the number of input ports required. Each input to the manifold requires one bandpass filter tuned for the input frequency. All of the signal power is directed to one manifold output.

The figures herein illustrate embodiments employing rigid coaxial lines for interconnection functions, variously showing cut-off cable ends and flanges that may show center conductors. While rigid coax is a useful form of transmission line in high-power applications such as entertainment broadcasting, it is to be understood that flexible coaxial line (sometimes characterized by helically-grooved outside conductor wall) may be preferred in some embodiments, while other forms of transmission line such as waveguide and open lines may be suitable for some applications. Considerations such as power levels and physical size for a particular frequency regime may be relevant when selecting suitable materials.

It is to be understood that the use of the terms “tee”, “tee section”, and “tee junction” herein in place of “junction section” is a simplification referring to a common and useful physical form of a three-port junction, well suited both to drawings and to physical realization. Other forms of three-port junction sections, including but not limited to what can be termed a “flat Y” section and an “XYZ” section, to be shown in later figures, are equally realizable and may be satisfactory in some embodiments.

FIG. 1 shows in plan view a single segment 10 of a combiner according to the inventive apparatus, having as the component parts of the segment 10 a single filter 12 and a junction section 14 component of the manifold. FIG. 1 further shows a short-circuited stub 16. The filter 12 may in some embodiments be a known type, internally coupling signals within an allowed frequency range from filter input port 18 to filter output port 20 with low loss and substantially invariant phase across the allowed frequency range. The filter 12 preferably rejects out-of-range signals back to their sources, both before the input 18 and after the output 20, with low leakage of the out-of-range signals through the filter 12. The filter 12 appears as a short circuit to out-of-range signals. An in-range signal fed to the input 18 travels through the filter 12 and out the output 20, and arrives at the tee junction 14, its entry point to the manifold, after passing through a connecting section 22.

Under conditions such as termination of both tee outputs in nonreactive loads, rather than in the stub 16 and output 28 shown in FIG. 1, the tee 14 would effectively split the signal at the filter output 20 into two signals. If the signal paths were well matched, the two signals would exhibit equal phase and magnitude, with half of the signal power exiting the tee junction 14 at the left port 24 and half exiting at the right port 26, and with the out-of-band short-circuit locus of the filter 12 (located slightly inboard from the filter output 20) serving in general as a common spatial reference point for phase of the two signals. In the embodiment shown, the signals behave instead as described below.

The stub 16 has an internal short circuit placed at an appropriate electrical distance from the tee junction 14, with L, the physical length 28 of the stub 16, chosen so that the resultant reactive circuit, viewed from the electrical center of the tee junction 14, appears as an infinite impedance. With no effective conduction path in that direction, all of the signal power is directed to the other tee output port 26. It is to be understood that the electrical length (in wavelengths) of the stub 16 is a function of frequency, so that an added filter, in order to see an infinite impedance in the stub 16, requires specific transmission line dimensions, as further addressed below.

Figure 2:
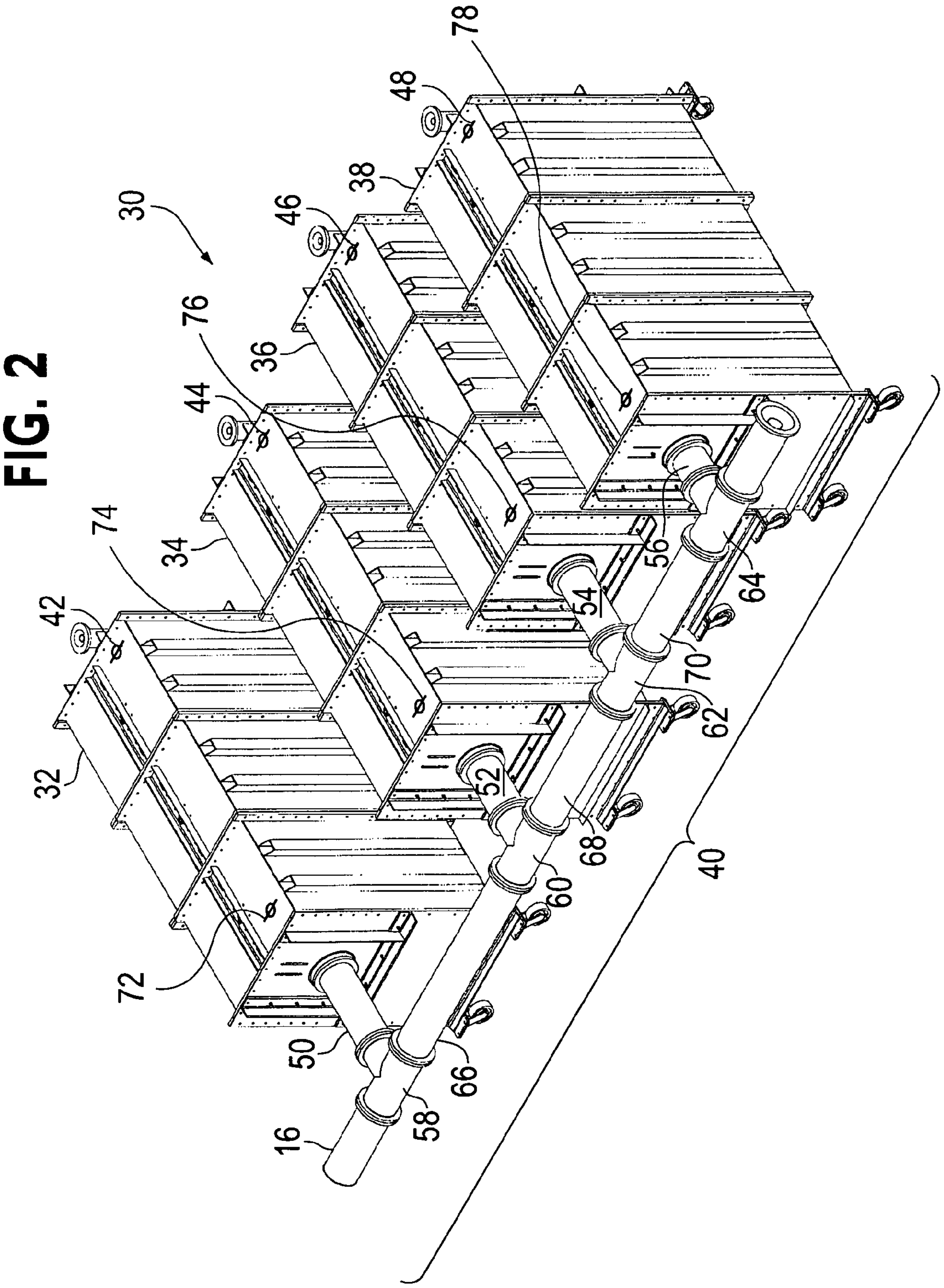
FIG. 2 is a perspective view of a complete combiner according to an embodiment of the invention.

FIG. 2 shows in perspective view a combiner 30 having a plurality of filters 32, 34, 36, and 38, and a complete manifold 40, including the shorted stub 16 of FIG. 1. Each filter 32, 34, 36, and 38 presents a short circuit to signals outside its respective passband at specific physical locations at the input and output side of the respective filter. Each filter thus serves, among other functions, to block signals present in the manifold 40 and originating from the other filters. This ensures that minimal levels of off-frequency signals make their way to the other transmitters. The bandpass filters 32, 34, 36, and 38 are substantially equally effective in both directions in some embodiments.

High-level RF signals enter, past respective out-of-band-signal-short-circuit input-side loci 42, 44, 46, and 48, through the respective filters 32, 34, 36, and 38. The RF signals then pass through respective filter connection sections 50, 52, 54, and 56 and exit, past respective out-of-band-signal-short-circuit output-side loci 72, 74, 76, and 78, into respective tee junctions 58, 60, 62, and 64. The respective tee junctions 58, 60, 62, and 64 are joined by manifold connection sections 66, 68, and 70. It is to be understood that the configuration of FIG. 2 is one of any number of alternatives, wherein the number of filters is a function of the number of channels to be combined, and can be increased or decreased as appropriate. Likewise, the use of a straight-line manifold 40 arrangement is a user option, shown for simplicity of presentation, as will be further addressed below. Details of joints between sections are not shown in the drawings, since many known and future methods are likely to be adaptable to the instant invention. The generic flanges shown are representative, and are familiar to those proficient in the art.

Figure 3:
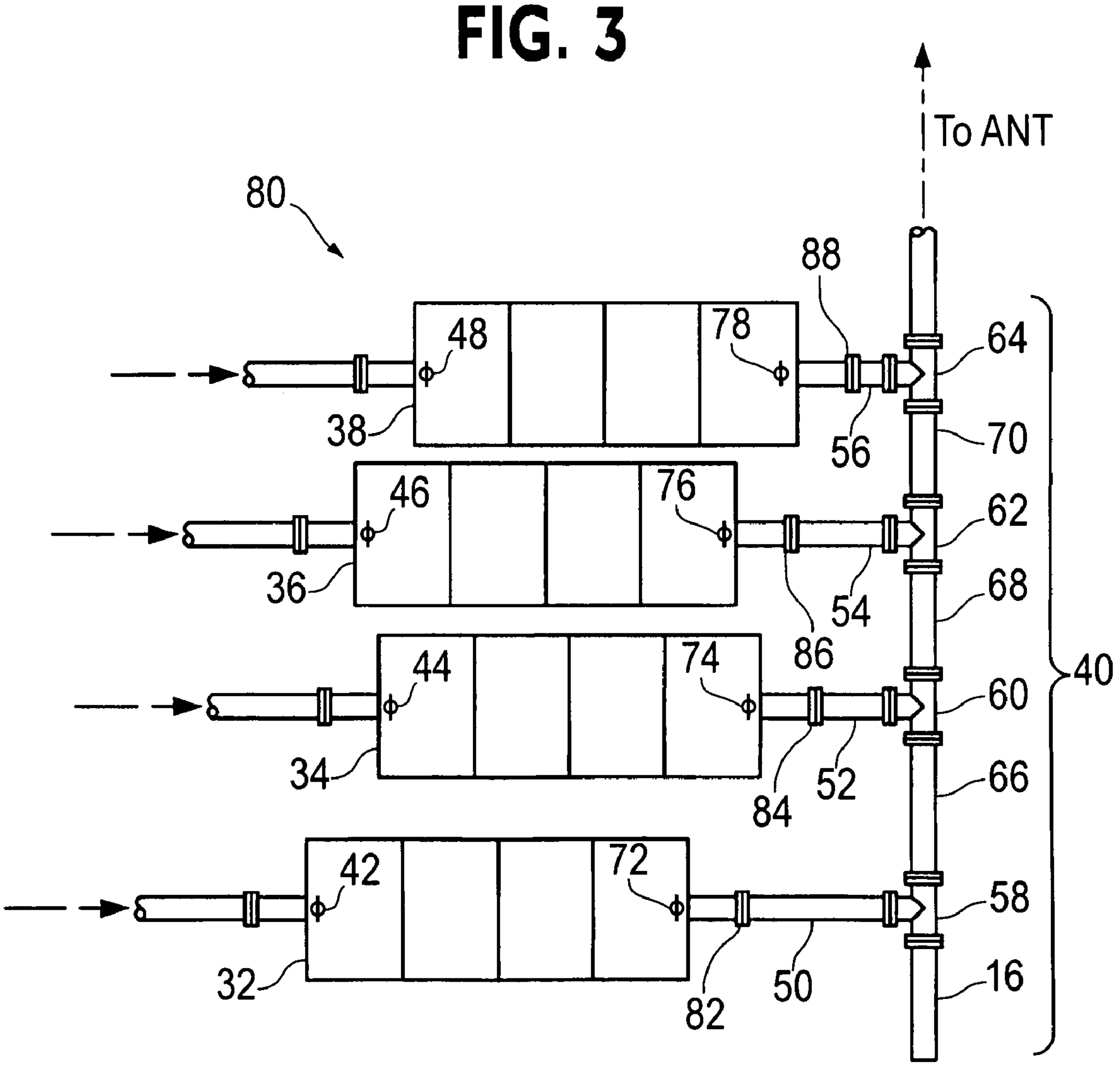
FIG. 3 is a block diagram of the combiner of FIG. 2.

FIG. 3 shows the functional elements of the combiner of FIG. 2 in block diagram 80 form. All input locus, filter, output locus, output segment, tee junction, shorting stub, and interconnecting section components of FIG. 2 are shown in general relation to their respective dimensions and positions in the perspective view. As noted, the use of four filters rather than another quantity is illustrative only.

The combination of the bandpass filters 32, 34, 36, and 38 that block out-of-band signals and the arrangement of the manifold 40 causes the signal at each filter's effective output port out-of-band short circuit locus 72, 74, 76, and 78 to see only one conductive path out of the combiner, with all other paths appearing as open circuits.

In manufacturing a combiner according to the instant invention, appropriate dimensioning of variable components, namely the short circuit stub 16 and the connection sections 50, 52, 54, 56, 66, 68, and 70, is required to ensure that overall combiner losses are minimized. One method for establishing the dimensions begins by identifying precisely the fixed dimensions, such as the output loci 72, 74, 76, and 78 with respect to the respective mounting flanges 82, 84, 86, and 88, computing the desired electrical distances between the respective filters, then assigning dimensions for the above-identified variable components. The variable components may then be fabricated, leaving sufficient unattached parts, such as flanges and the remainder of their associated connection sections, to permit adjustment, followed by clamping the unattached parts together to form complete electrical paths. Performance of this clamped-together combiner may then be measured by injecting, for example, low-power signals into all of the inputs and verifying function. Precise signal measurement, fine tuning of dimensions, and, ultimately, final assembly (such as by welding of clamped joints) and high-power test can confirm that the manifold combiner for the specific set of channels is correctly implemented.

Figure 4:
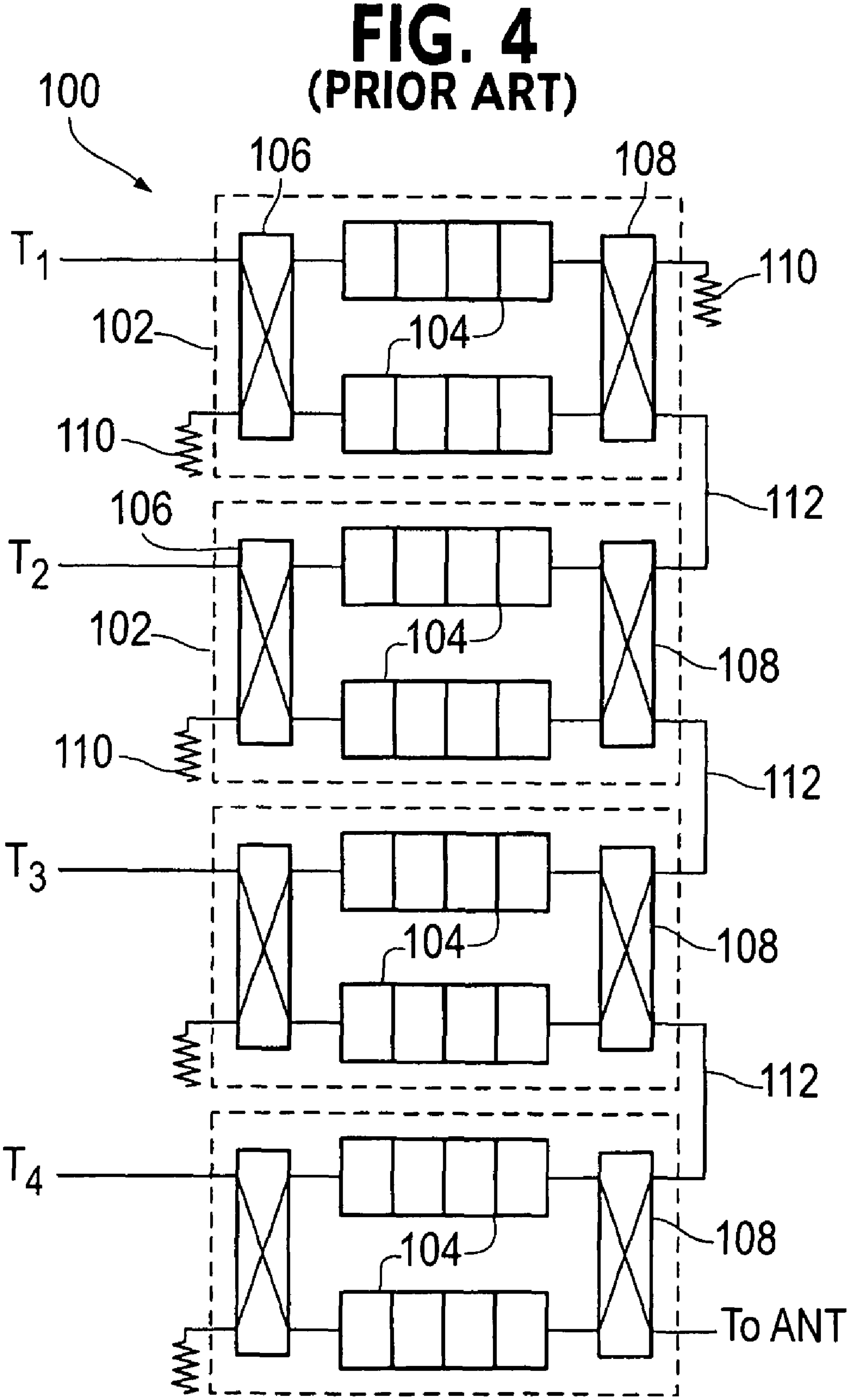
FIG. 4 (PRIOR ART)
FIG. 4 is a block diagram of a combiner employing predecessor apparatus.

FIG. 4 shows a block diagram of the functional elements of a predecessor apparatus 100 using a plurality of CIFs 102. Capability of this design can be used as a baseline to evaluate a manifold combiner according to the inventive apparatus, with tradeoffs as addressed below. In a predecessor apparatus 100, CIF groups 102 are made up of pairs of filters 104 supported by respective input 3 dB hybrids 106 and output 3 dB hybrids 108. The individual CIFs 102 are manufactured to operate at specified frequencies, with the overall apparatus able to form a combined output signal. Unused ports can be terminated in nonreactive channel loads 110 to suppress reflections. Given that the components, such as the filters 104, transmission lines 112, and the like, are generally equivalent in size to corresponding components of a manifold combiner as shown in FIG. 3, it can be appreciated that overall apparatus size and complexity are substantially greater for the predecessor apparatus 100. It is to be understood that each of the filters 104, at least, is either uniquely sized or precisely adjusted to operate at a specific channel frequency. Thus, while interchange of components and reassignment of frequencies is possible for the predecessor apparatus 100, such modifications are not trivial where each filter 104 and hybrid 106, 108 component in each CIF 102 is on the order of 2 meters by 1 meter by 0.7 meters in size for typical FM radio broadcast applications.

In manufacturing a combiner according to the predecessor apparatus 100, the CIFs 102 are, at least nominally, capable of being combined with any number of like devices to form a combined output signal. In the predecessor apparatus 100, the filter assemblies 104 are, to a significant extent, noninteroperating. As a result, mutual dependency between CIFs 102 is slight, and additional CIFs 102 may be added and removed with relatively little impact in some embodiments. The principal tradeoff in the predecessor apparatus 100, compared to a manifold combiner according to the instant invention, is that the number of large, expensive components is increased on the order of threefold or fourfold with the predecessor, as is the physical size of the total assembly.

As a corollary, since all of the components in both predecessor and instant approaches are finitely efficient, power dissipation due to insertion loss per component may be expected to increase with combiner complexity, so the predecessor apparatus 100 may have increased waste power, assuming comparable workmanship. This can translate to either requiring larger or more highly stressed transmitters to achieve a specific antenna power level, or losing some broadcasting range if the transmitters' output levels are constrained. The waste power from added apparatus and from the channel loads 110 can likewise add to cooling requirements for the broadcast operator.

Figure 5:
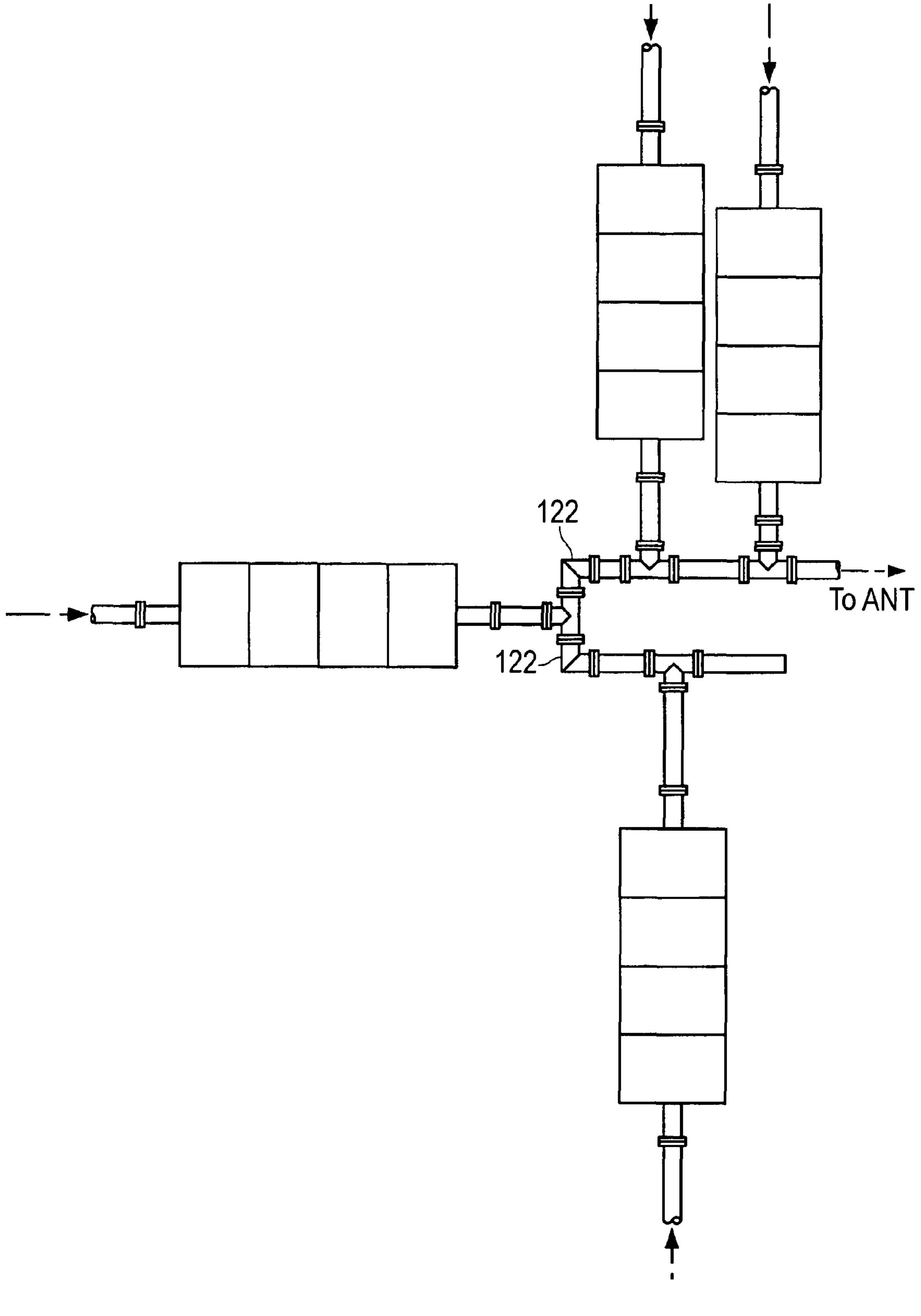
FIG. 5 is a block diagram of an alternate combiner configuration according to an embodiment of the invention.
Figure 6:
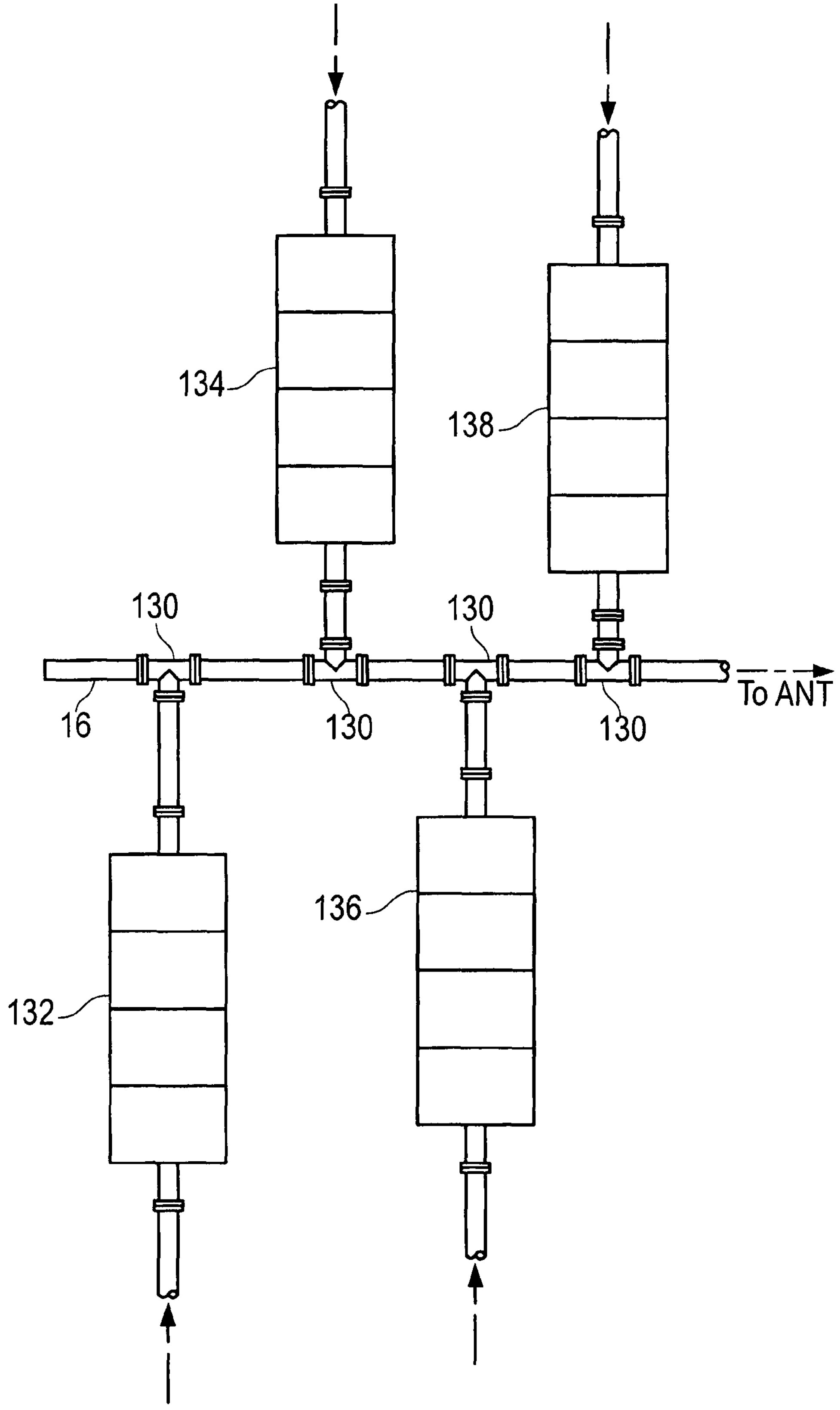
FIG. 6 is a block diagram of another alternate combiner configuration according to an embodiment of the invention.

A number of alternative embodiments for manifold combiners according to the instant invention are realizable. The layout shown in FIGS. 2 and 3 uses a straight-line approach, with all feeds from one side and the output at right angles thereto. As shown in FIG. 5, addition of elbows 122 at desired angles in place of or as partial substitutes for one or more of the straight sections, for example, can position the inputs substantially radially. Similarly, as shown in FIG. 6, alternating the orientation of the tees 130 can alter positioning of the respective transmitters 132, 134, 136 and 138 without appreciably affecting performance. Position order of channels according to frequency, e.g., with the lowest channel frequency proximal to the stub 16 in FIG. 2 and highest farthest therefrom, or another arrangement, optional in some embodiments, may be dictated by the requirements for particular channel assignments in other embodiments.

Figure 7:
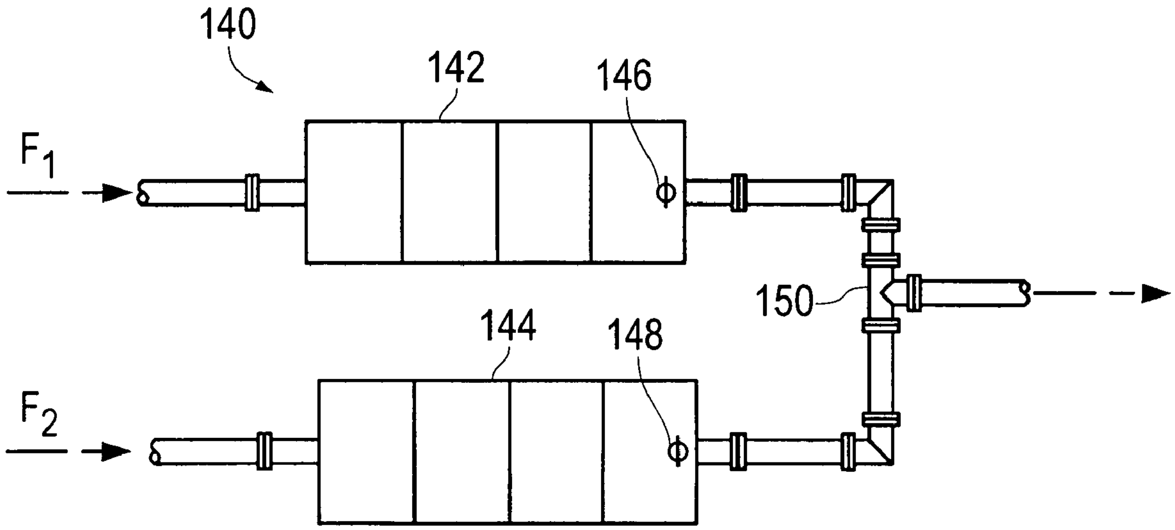
FIG. 7 (PRIOR ART)
FIG. 7 is a block diagram of a branch combiner employing predecessor apparatus.

FIG. 7 shows a two-way branch combiner 140 according to known practice. The branch combiner shown is capable of combining two transmitter output signals of different frequencies. Since each of the filters 142 and 144, respectively, appears as a short circuit to out-of-band signals, it is possible to realize a combiner by ensuring that the lengths of the signal paths from the respective effective short-circuit loci 146 and 148 to the common tie point at the center of the tee 150 are each a quarter wavelength of the signal applied to the other filter. For example, if a first signal $F_1$, applied to the first filter 142, is centered at 95.7 MHz, where a quarter wavelength (in large 50 ohm air-filled coax) is about 60 cm, and a second signal $F_2$, applied to the second filter 144, is centered at 103.5 MHz, where a quarter wavelength is about 55 cm, then the effective path from the output short-circuit locus of the first filter 142 to the center of the tee 150 should be 55 cm, so that the short circuit in the first filter 142 appears as an open circuit to the $F_2$ signal, and the only available path for the $F_2$ signal leads out through the third port of the tee 152. An equivalent process defines the length of the second leg of the branch combiner. It is to be understood that any odd multiple of one-quarter wavelength, that is, $((2n+1)*\lambda)/4$ for n a counting number, will realize the required port impedance translation, but it is noted that bandwidth tends to drop off with increased line length, so that a minimal value of n may be preferred.

Figure 8:
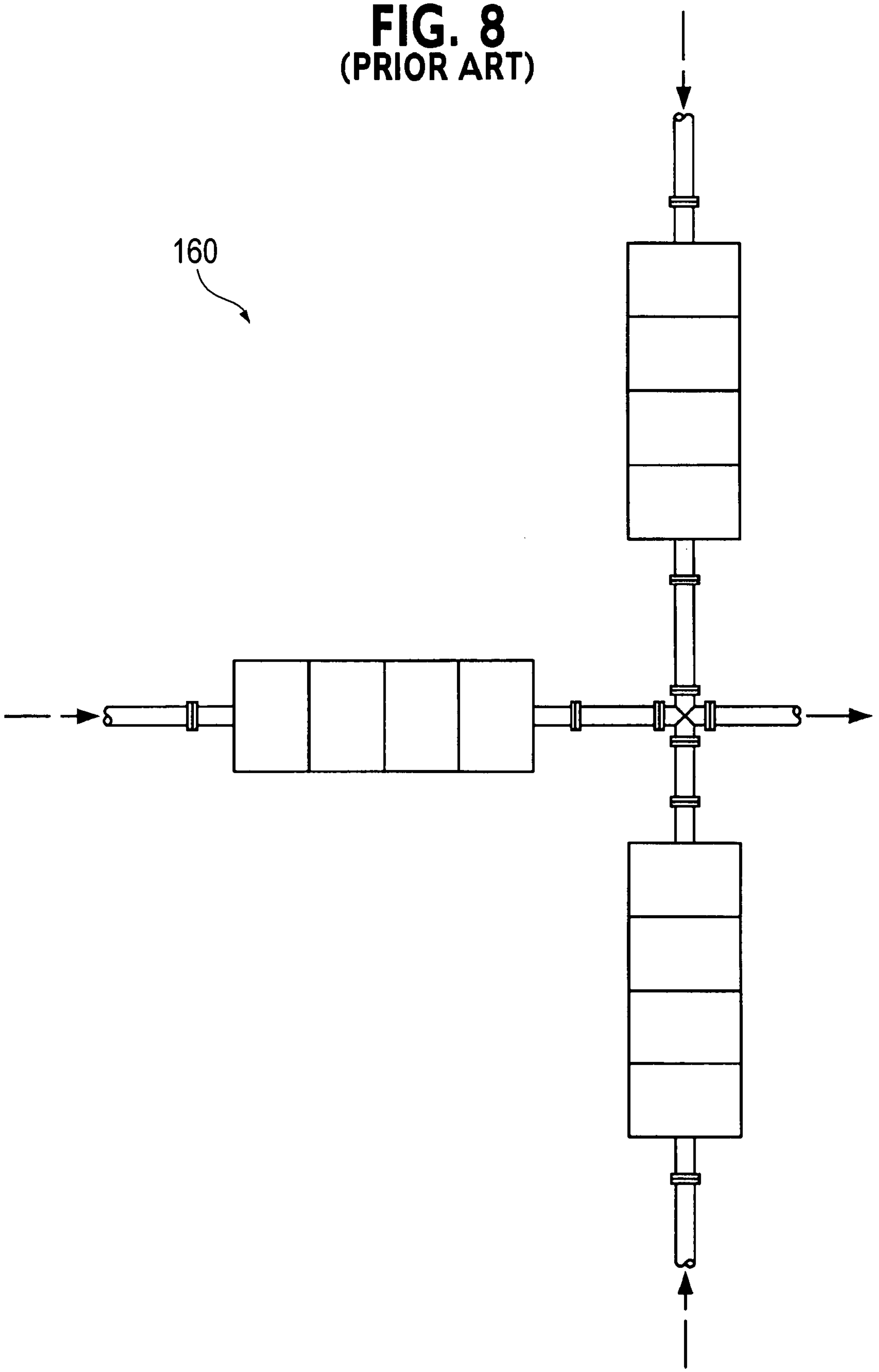
FIG. 8 (PRIOR ART)
FIG. 8 is another block diagram of a branch combiner configuration employing predecessor apparatus.

FIG. 8 shows a three-way branch combiner 160 substantially analogous to the two-way combiner of FIG. 7. In this application, the three signal line lengths must each generally satisfy the requirement of translating both of the other short circuits to opens. This is realizable to an acceptable approximation, provided the channel frequencies are fairly close together and fairly uniformly separated. Branch combiners approach a practical limit according to known practice with the three-way apparatus shown. The requirement that each filter appear as a short circuit for all of the other frequencies an odd number of quarter wavelengths back from a single, common combining node becomes marginally realizable with the three-way branch combiner. Both the computations for the dimensions and ordinary spatial limitations for adding still more devices make branch combiners with four or more inputs increasingly complex without providing offsetting benefits in likely applications.

By contrast with the branch combiner, the manifold combiner of the instant invention is capable of providing a more satisfactory approximation of the impedance translation function, wherein the limitations of branch combiners are overcome to a significant extent while the cost and size penalties of CIF-based combiners are avoided. The use of a plurality of tee junctions, a plurality of connecting sections, and at least one stub provide an increased number of variables, so that the individual sections can be kept short enough to reduce bandwidth loss while allowing all of the rejection requirements to be realized.

Lengths of all connecting sections and the shorting stub may be calculated for each allowable configuration permutation, with excess variables assigned values that maximize performance terms such as bandwidth. For example, in a simplified case 240 shown in FIG. 13, using only two filters, $F_1$ 242 of wavelength $\lambda_1$ and $F_2$ 244 of wavelength $\lambda_2$, wherein $F_1$ 242 is closer to the stub 246, the distance from the tee 250 proximal to $F_2$ 244 to the short circuit (end) of the stub 246 and from the $F_2$ tee 250 to the $F_1$ output short circuit point 252 are each $((2n_i+1)*\lambda_2)/4$ to a good approximation, with the values of the $n_i$ allowed to differ, and the distance from the tee 256 proximal to $F_1$ 242 to the short circuit (end) of the stub 246 and from the $F_1$ tee 256 to the $F_2$ output short circuit point 258 are each $((2n_i+1)*\lambda_1)/4$, with the $n_i$ again allowed to differ. This case 240 has four adjustable elements 246, 260 and four lengths to be set, and thus may have only a single solution for minimum element lengths. Similarly, the case shown in FIG. 3 has eight adjustable elements, 16, 50, 52, 54, 56, 66, 68, and 70, for four frequencies, which should ordinarily be sufficient to develop at least one solution. Where too many variables in the form of connecting section and stub lengths exist, as shown in FIG. 14 for a four-filter variation 280 on the embodiment of FIG. 3, providing ten adjustable elements 282, preferred values such as standard product dimensions can be assigned. If multiple solutions occur, selection may be made based on extrinsic considerations such as fit of filters adjacent to each other, room size, and the like.

Figure 13:
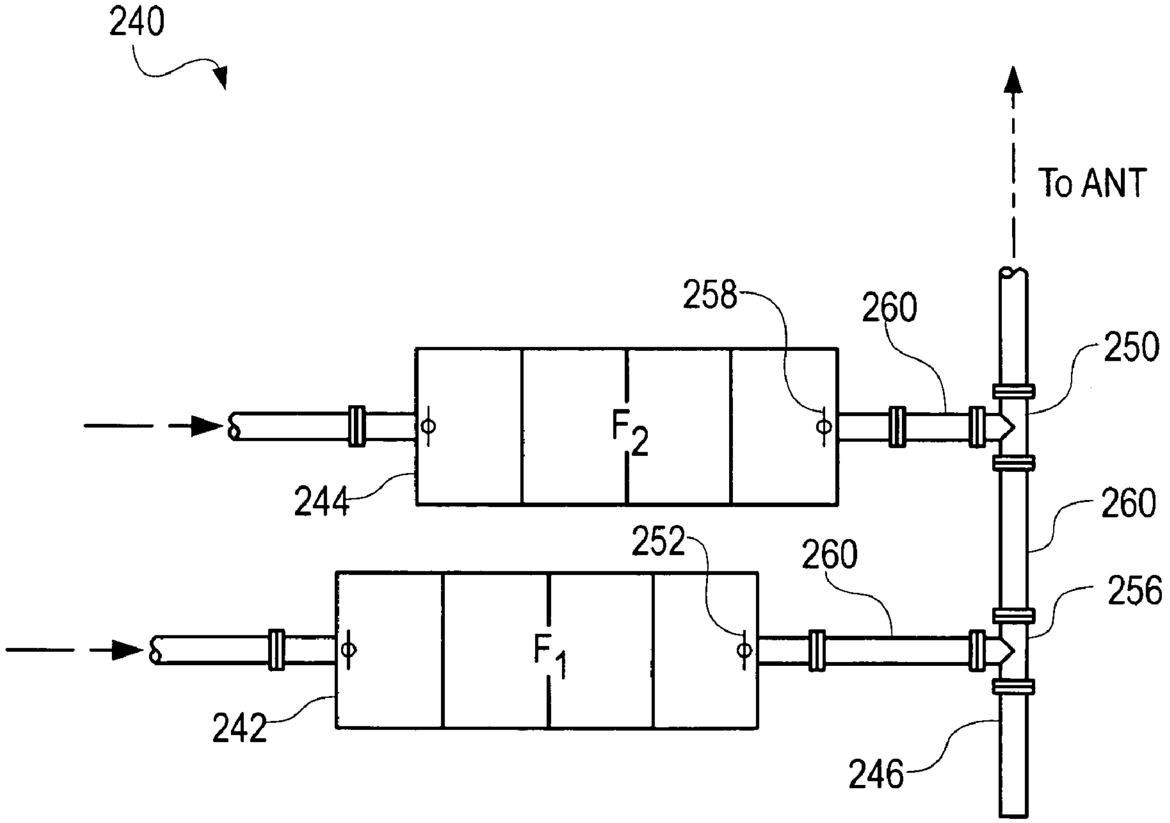
FIG. 13 is a simplified configuration of a combiner according to an embodiment of the invention.
Figure 14:
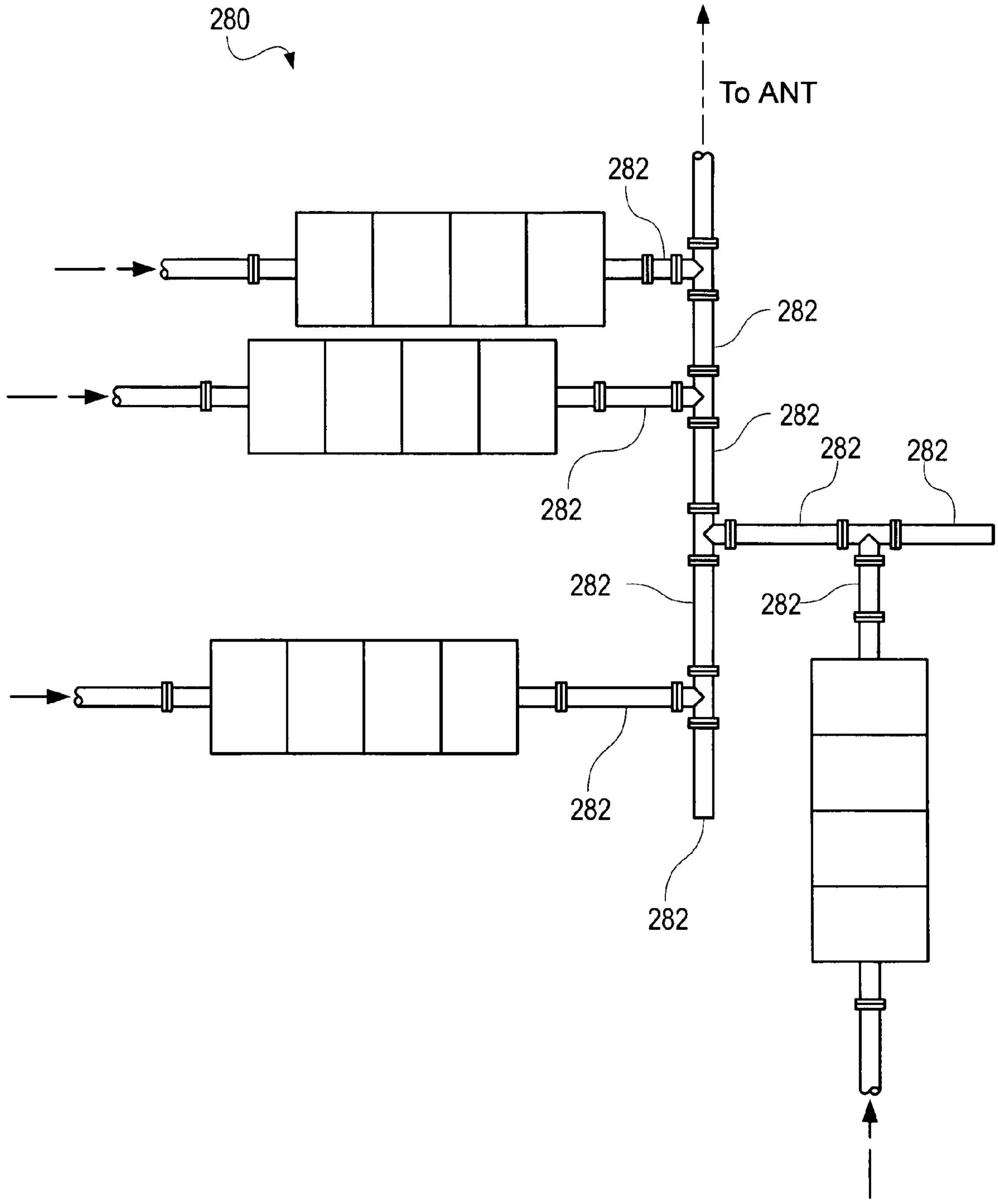
FIG. 14 is a configuration providing an additional tuning component.

The above process can be repeated with $F_1$ 242 and $F_2$ 244 in FIG. 13 swapped, so that a second set of solutions may be compared for desirable attributes. For situations more likely in practice than that of FIG. 13, such as with three or more transmitters and associated filters, the increased number of permutations may produce several near-optimal solutions. Preference criteria such as cost, expandability, and/or one or more additional factors may be used to rank the configurations. Moreover, in applications wherein it may be anticipated that additional transmitters of known frequencies are likely be added subsequently to an original installation, solutions compatible with the later configuration can be provided for using such extra components. In all cases, it is to be understood that engineering experience may be the final determinant.

The result of employing a manifold combiner according to the instant invention is to combine several isolated signals onto a single transmission line, with the signals maintaining their isolation until presented to an antenna for broadcast or otherwise employed. In typical applications, the signals are of similar power and individual bandwidth but differ from one another in center frequency.

Where a user has a working manifold combiner according to the instant invention but subsequently requires an additional broadcast channel, at least two realization methods for adding a channel are feasible.

Figure 9:
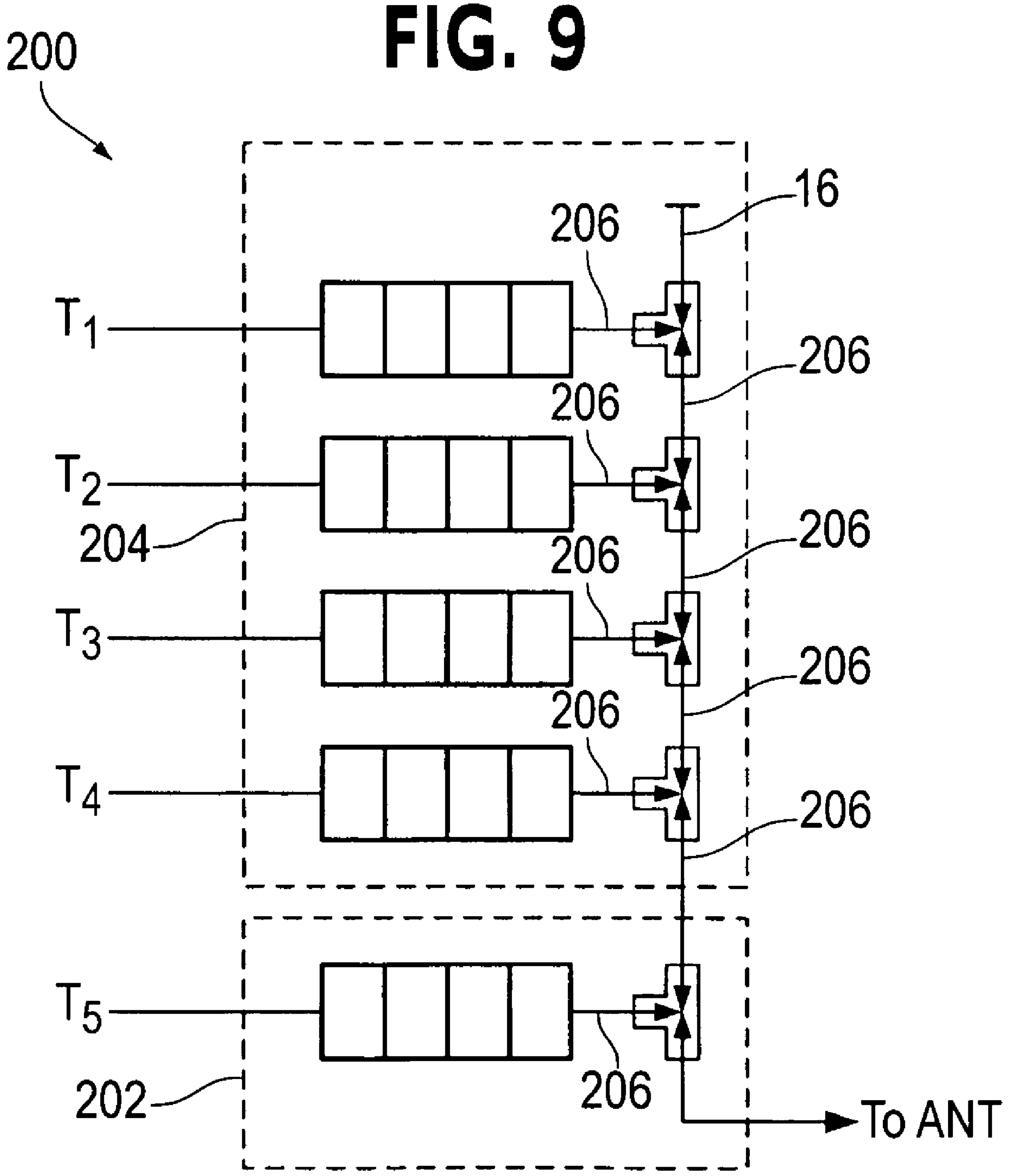
FIG. 9 is a block diagram of a combiner configuration according to an embodiment of the invention, wherein an additional channel is added.

FIG. 9 shows one method 200 for adding a channel, wherein the assembly process above, illustrated in FIGS. 2 and 3 and/or FIG. 5 or 6, is repeated, adding a channel ($T_5$) 202 to the set 204 previously in use. Because all of the variable connection sections 206 and the stub 16 tend to interact, it can be necessary to deactivate the manifold combiner long enough to alter or replace an appreciable number of the variable sections 206 and/or the stub 16, as well as to perform low-level and high-level testing after the alteration. In an extreme case, all variable sections 206 and the stub 16 may be reusable without alteration, albeit possibly shifting positions of the variable sections 206; at the other extreme, all variable sections 206 and the stub 16 may require alteration or replacement. The particular channel frequencies combined, or a capability within an installation to reorder the filters themselves, may affect the required extent of alteration.

Figure 10:
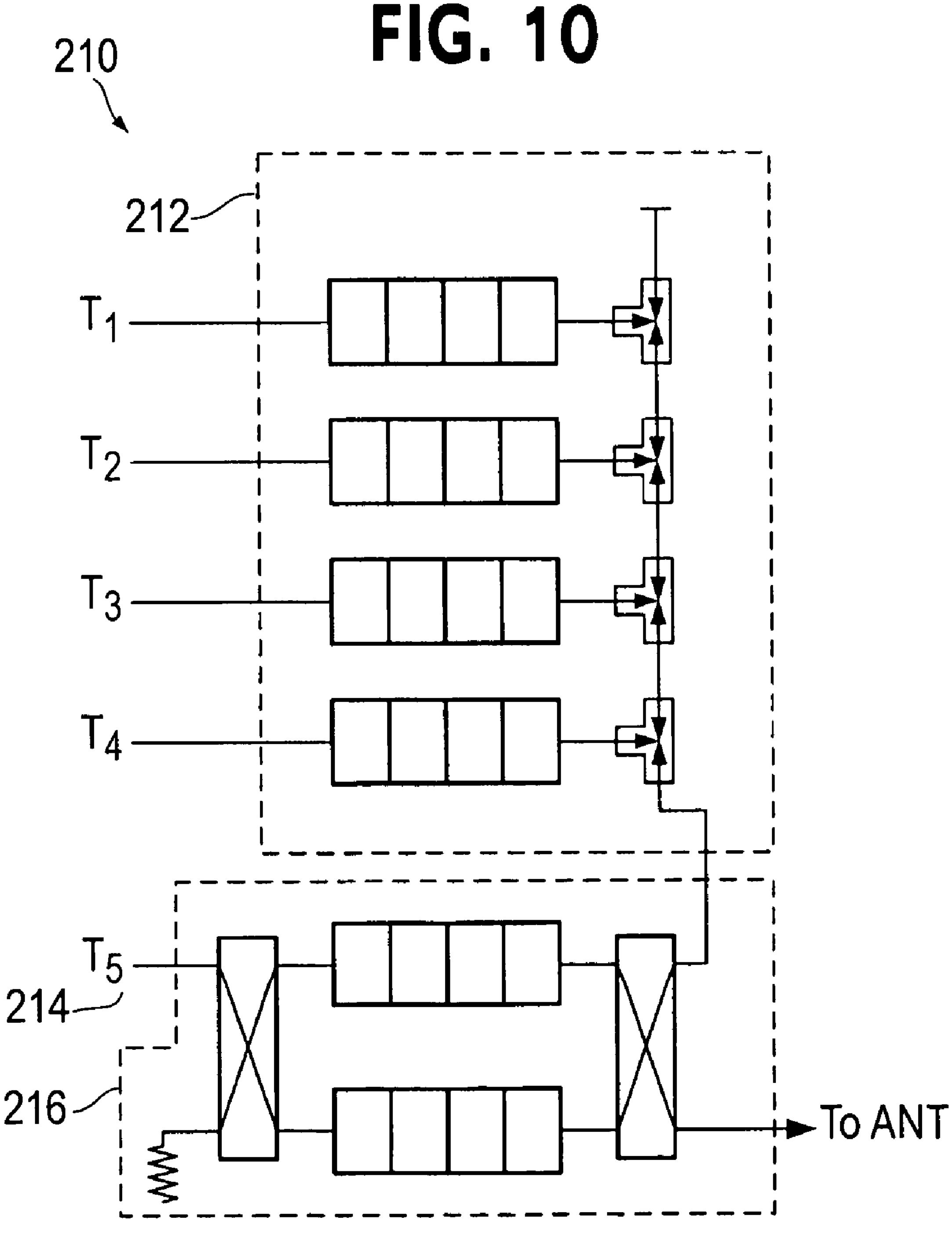
FIG. 10 is a block diagram of another alternate combiner configuration according to an embodiment of the invention, wherein an additional channel is added.

FIG. 10 shows a second method 210, wherein the combined output signal from the combiner 212 can be joined with the new signal $T_5$ 214 using a constant impedance filter module 216, which can be of the type shown in FIG. 4, to perform the extra combining function. It should be noted, as is evident in the drawing, that the cost in added materials and physical space within a transmitter building for this method may be comparable to that of the entire original installation of the combiner 212, in contrast with the method of FIG. 9, wherein size and material impact are generally less. The advantage of potentially avoiding acquiring, calibrating, or reworking numerous small components in the manifold combiner is thus traded off against size and material cost for the large components.

The significance of adopting manifold combiners according to the instant invention, when compared to some established methods (such as CIFs) for performing like functions, includes at least allowing a much smaller combiner to be built at a greatly reduced material cost with essentially no sacrifice in electrical performance. Indeed, as noted, energy cost, signal reach, and/or facility reliability may be improved in some embodiments due to reduced overall insertion loss. In addition, the number of channels that can be combined, as well as flexibility in frequency spacing of channels, may exceed practical limitations of other established methods (such as branch combiners).

Figure 11:
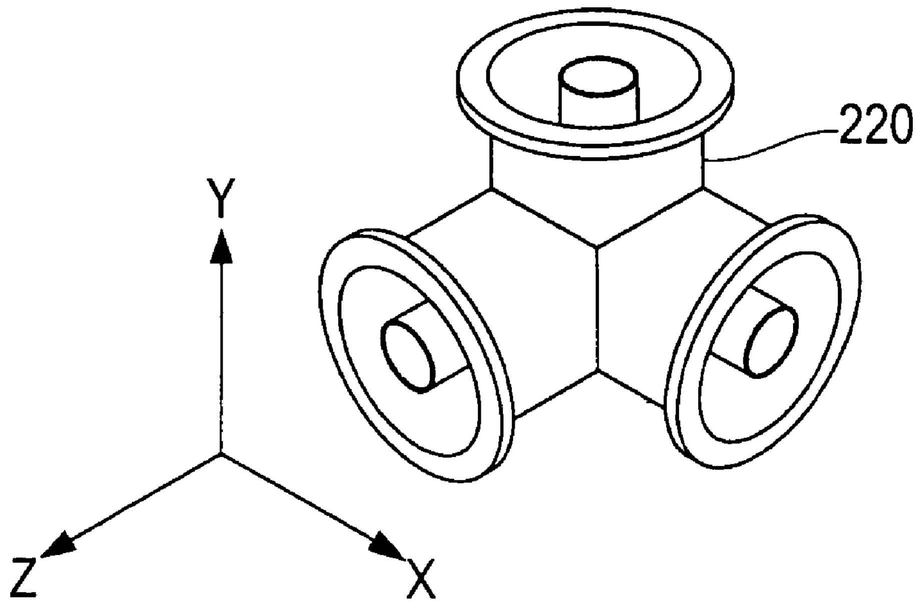
FIG. 11 is a perspective view of an alternative junction section for a combiner according to an embodiment of the invention.
Figure 12:
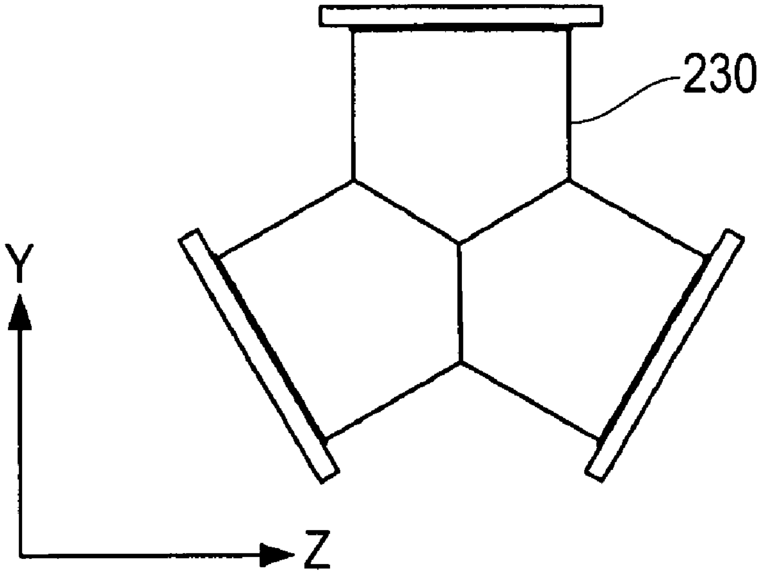
FIG. 12 is a plan view of another alternative junction section for a combiner according to an embodiment of the invention.

All of the embodiments thus far presented, for both prior art and the instant invention, are coplanar—i.e., place all of the filters and other apparatus on a common, generally horizontal surface—and employ various orientations to facilitate feed from transmitters. While this may be appropriate in general because of the large size and massive weight of individual components, it is to be understood that some embodiments may place components on more than one level, with elbows and the like used as needed. The effective lengths of interconnecting lines must nonetheless satisfy the requirement for the manifold that only a single output node from the combiner exists for all signals, with the out-of-band short circuits of all other nodes so spaced as to appear as open circuits. Where appropriate, three-axis (orthogonal) tee junctions 220, as shown in FIG. 11, or non-orthogonal junctions 230, as shown in FIG. 12, may be included in coplanar or non-coplanar embodiments.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

What is claimed is:

1. A combiner segment for a radio frequency (RF) signal having a center frequency and a bandwidth, consisting essentially of:

- a single bandpass filter, having an input port and an output port, that behaves as a short circuit at specified locations to frequencies outside the passband thereof, the bandpass filter having low in-range signal loss and low out-of-range signal leakage;
- a coaxial tee junction including an input port and two output ports; and
- a coaxial connecting section, coupled to the bandpass filter output port and the coaxial tee junction input port, having a length.

2. The combiner segment of claim 1, wherein the bandpass filter rejects out-of-band signals at the input port and the output port of the bandpass filter.

3. The combiner segment of claim 2, wherein the bandpass filter input port behaves as a short circuit with respect to the out-of-band signals input thereto.

4. The combiner segment of claim 2, wherein the bandpass filter output port behaves as a short circuit with respect to the out-of-band signals input to the bandpass output port.

5. The combiner segment of claim 3, wherein the bandpass filter input port has a spatial reference point slightly inboard of the input port of the bandpass filter, the spatial reference point providing a locus at which the input port behaves as a short circuit with respect to the out-of-band signals.

6. The combiner segment of claim 3, wherein the bandpass filter output port has a spatial reference point slightly inboard of the bandpass filter output port, the spatial reference point providing a locus at which the bandpass filter output port behaves as a short circuit with respect to the out-of-band signals.

7. A combiner for radio frequency (RF) signals, comprising:

- a plurality of input ports;
- a plurality of combiner segments, coupled to the plurality of input ports, each consisting essentially of:
  - a single bandpass filter, having an input port and an output port, that behaves as a short circuit at specified locations to frequencies outside a passband thereof,
  - a coaxial tee junction including an input port and two output ports, and
  - a coaxial connecting section, coupled to the bandpass filter output port and the coaxial tee junction input port, having a length;
- a plurality of coaxial manifold connection sections, coupled to the plurality of combiner segments, each consisting essentially of:
  - a coaxial input port connected to one of the output ports of one of the coaxial tee junctions,
  - a coaxial section having a length, and
  - a coaxial output port connected to one of the output ports of a different one of the coaxial tee junctions;
- a coaxial stub termination, coupled to one of the coaxial tee junctions, consisting essentially of:
  - a coaxial input port, and
  - a coaxial section having a length and an internal short circuit disposed at a predetermined distance from the coaxial input port; and
  - an output port coupled to one of the coaxial tee junctions.

8. The combiner of claim 7, wherein the output port of the coaxial stub termination is coupled to an antenna.

9. The combiner of claim 7, wherein each of the bandpass filters operates on a different channel.

10. The combiner of claim 7, wherein each of the bandpass filter input ports and output port behaves as a short circuit, at respective loci, for out-of-band RF signals input thereto.

11. The combiner of claim 10, wherein the lengths of the bandpass filter coaxial connection sections, manifold connection coaxial sections, and stub coaxial section are selected such that each of the bandpass filter short-circuit loci is located at an odd number of quarter-wavelengths from the other bandpass filter short-circuit loci.

12. The combiner of claim 11, wherein the respective lengths of the manifold connection sections are different.

13. The combiner of claim 7, wherein an additional tee junction and an additional manifold connection section are disposed between one of the tee junctions and one of the manifold connection sections, and an additional stub termination is connected to a remaining port.

14. The combiner of claim 7, wherein at least one of the manifold connection sections has an elbow shape.

15. The combiner of claim 7, wherein at least one of the tee junctions has a planar arrangement with angles between coaxial segments of the at least one tee junctions that are non-orthogonal.

16. The combiner of claim 7, wherein at least one of the tee junctions has a non-planar arrangement with angles between coaxial segments of the at least one tee junctions that are orthogonal.

* * * * *